United States Patent
Lee et al.

(10) Patent No.: US 11,039,537 B1
(45) Date of Patent: Jun. 15, 2021

(54) ELECTRONIC COMPONENT EMBEDDED SUBSTRATE

(71) Applicant: SAMSUNG ELECTRO-MECHANICS CO., LTD., Suwon-si (KR)

(72) Inventors: Sang Yoon Lee, Suwon-si (KR); Tae Seong Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/803,263

(22) Filed: Feb. 27, 2020

(30) Foreign Application Priority Data

Dec. 16, 2019 (KR) .................. 10-2019-0167958

(51) Int. Cl.
*H05K 1/18* (2006.01)
*H05K 1/11* (2006.01)

(52) U.S. Cl.
CPC ............. *H05K 1/186* (2013.01); *H05K 1/115* (2013.01); *H05K 2201/10515* (2013.01)

(58) Field of Classification Search
CPC .................. H05K 1/186; H05K 1/183; H05K 2201/10515; H05K 1/184; H05K 1/182; H05K 3/4697; H05K 3/4602; H05K 1/185; H05K 2201/10; H05K 3/4617; H05K 2201/096; H05K 3/24; H01L 21/56; H01L 21/563; H01L 2224/16225
See application file for complete search history.

(56) References Cited

U.S. PATENT DOCUMENTS

| | | | | |
|---|---|---|---|---|
| 2007/0069371 A1* | 3/2007 | Iksan | ................ | H01L 23/3128 257/706 |
| 2007/0235215 A1* | 10/2007 | Bathan | ............... | H01L 23/4334 174/260 |
| 2008/0296056 A1* | 12/2008 | Kinoshita | .............. | H01L 23/13 174/261 |
| 2011/0068459 A1* | 3/2011 | Pagaila | ................ | H01L 24/97 257/698 |

(Continued)

FOREIGN PATENT DOCUMENTS

KR 10-2002-0042958 A 6/2002

*Primary Examiner* — Steven T Sawyer
(74) *Attorney, Agent, or Firm* — Morgan, Lewis & Bockius LLP (57) ABSTRACT

An electronic component embedded substrate includes a core member including a first wiring layer, a first insulating layer covering the first wiring layer and having a first through-portion, a second wiring layer disposed on the first insulating layer, and a second insulating layer disposed on the first insulating layer and having a second through-portion exposing at least a portion of the second wiring layer; a first electronic component disposed in the first through-portion; a second electronic component disposed in the second through-portion; and an insulating resin covering at least a portion of each of the first electronic component and the second electronic component. The second wiring layer includes a first wiring pattern having a portion covered with the second insulating layer, and a second wiring pattern having a portion covered with the insulating resin. The second electronic component is connected to the second wiring pattern.

13 Claims, 8 Drawing Sheets

(56) References Cited

U.S. PATENT DOCUMENTS

| | | | |
|---|---|---|---|
| 2015/0262928 A1* | 9/2015 | Shen | H01L 23/04 257/676 |
| 2015/0334841 A1* | 11/2015 | Schmid | H05K 1/0298 361/761 |
| 2016/0037645 A1* | 2/2016 | Lee | H05K 1/186 361/761 |
| 2016/0338202 A1* | 11/2016 | Park | H01L 24/00 |
| 2017/0047308 A1* | 2/2017 | Ho | H01L 23/5386 |
| 2018/0096927 A1* | 4/2018 | Kim | H01L 23/49822 |
| 2018/0108542 A1 | 4/2018 | Pagaila et al. | |

* cited by examiner

ELECTRONIC COMPONENT EMBEDDED SUBSTRATE

CROSS-REFERENCE TO RELATED APPLICATION

This application claims benefit of priority to Korean Patent Application No. 10-2019-0167958 filed on Dec. 16, 2019 in the Korean Intellectual Property Office, the disclosure of which is incorporated herein by reference in its entirety.

TECHNICAL FIELD

The present disclosure relates to an electronic component embedded substrate.

BACKGROUND

Recently, as an electronic device such as smartphone, PC, or the like is required to have high performance and high functionality, the number of electronic components to be mounted on a printed circuit board is increasing. In this case, in terms of miniaturization and thinning of the electronic device, shortening of a connection path between the electronic components, improvements in noise, or the like, a technology for electronic component embedded substrates embedding electronic components such as passive elements, active elements, or the like in the printed circuit board has been developed. In such an electronic component embedded substrate, a structure for increasing the number of electronic components embedded therein is required.

SUMMARY

An aspect of the present disclosure is to provide an electronic component embedded substrate including a plurality of electronic components, allowing for miniaturizing and thinning of a product.

Another aspect of the present disclosure is to provide an electronic component embedded substrate having improved freedom of wiring design.

According to an aspect of the present disclosure, an electronic component embedded substrate includes a core member including a first wiring layer, a first insulating layer covering the first wiring layer and having a first through-portion, a second wiring layer disposed on the first insulating layer, and a second insulating layer disposed on the first insulating layer and having a second through-portion exposing at least a portion of the second wiring layer; a first electronic component disposed in the first through-portion; a second electronic component disposed in the second through-portion; and an insulating resin covering at least a portion of each of the first electronic component and the second electronic component. The second wiring layer includes a first wiring pattern in which at least a portion of an upper surface of the second wiring layer is covered with the second insulating layer, and a second wiring pattern in which at least a portion of the upper surface of the second wiring layer is covered with the insulating resin. The second electronic component is connected to the second wiring pattern.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, the present disclosure will be described with reference to the accompanying drawings. Shape and size of the elements in the drawings may be exaggerated or reduced for more clear description.

Electronic Device

Figure 1:
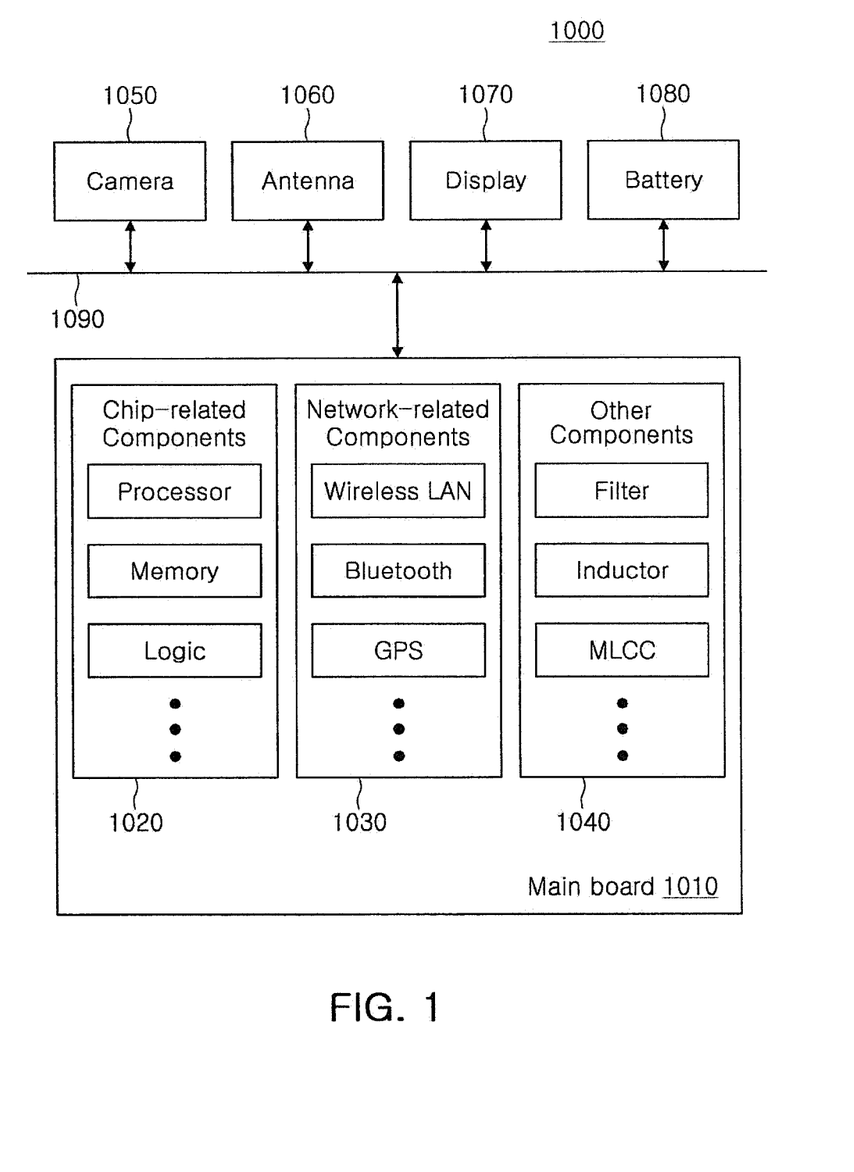
FIG. 1 is an example of a block diagram schematically illustrating an electronic device system according to an example.

FIG. 1 is an example of a block diagram schematically illustrating an electronic device system according to an example.

Referring to the drawings, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
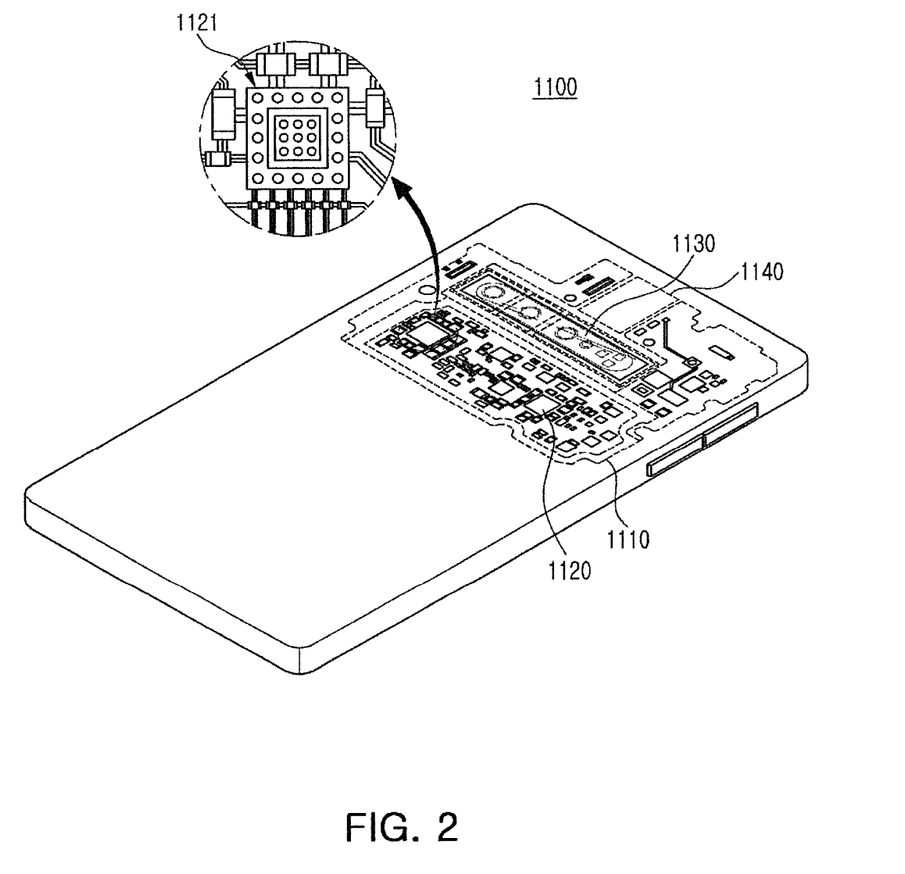
FIG. 2 is a perspective view schematically illustrating an electronic device according to an example.

FIG. 2 is a perspective view schematically illustrating an electronic device according to an example.

Referring to the drawings, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. The electronic device is not necessarily limited to the smartphone 1100, but may be other electronic devices as described above.

Electronic Component Embedded Substrate

Figure 3:
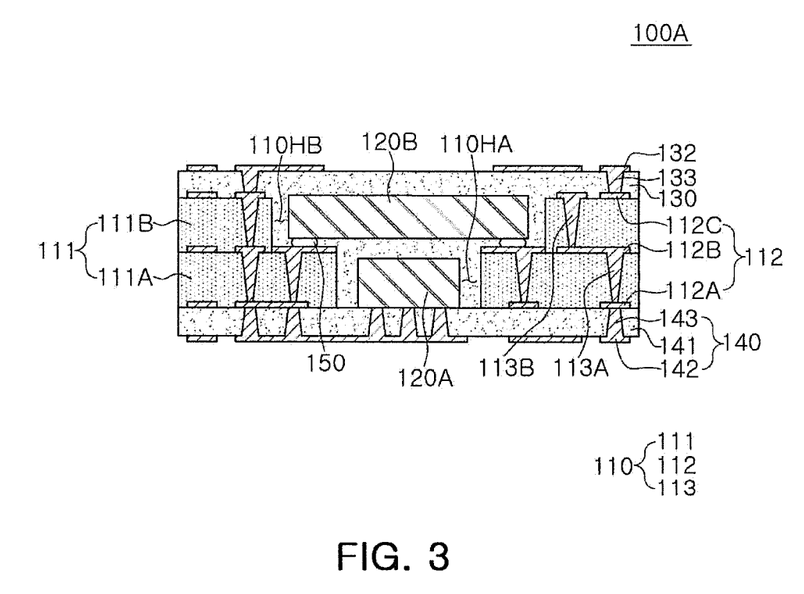
FIG. 3 is a cross-sectional view schematically illustrating an electronic component embedded substrate 100A according to an example.

FIG. 3 is a cross-sectional view schematically illustrating an electronic component embedded substrate 100A according to an example.

Referring to FIG. 3, an electronic component embedded substrate 100A according to an example may include a core member 110, a first electronic component 120A disposed in a first through-portion 110HA of the core member 110, a second electronic component 120B disposed in a second through-portion 110HB of the core member 110, and an insulating resin 130 covering at least a portion of each of the first electronic component 120A and the second electronic component 120B.

The core member 110 may include a plurality of insulating layers and a plurality of wiring layers. For example, the core member 110 may include a first wiring layer 112A, a first insulating layer 111A covering the first wiring layer 112A and having the first through-portion 110HA, a second wiring layer 112B disposed on the first insulating layer 111A, a first via 113A passing through the first insulating layer 111A and connecting the first wiring layer 112A and the second wiring layer 112B to each other, a second insulating layer 111B disposed on the first insulating layer 111A and having the second through-portion 110HB, a third wiring layer 112C disposed on the second insulating layer 111B, and a second via 113B passing through the second insulating layer 111B and connecting the second wiring layer 112B and the third wiring layer 112C to each other.

The electronic component embedded substrate 100A according to an example may further include a wiring layer 132 disposed on the insulating resin 130, and a via 133 passing through the insulating resin 130 and connecting the wiring layer 132 and the third wiring layer 112C of the core member 110 to each other.

The electronic component embedded substrate 100A according to an example may further include a connection member 140 including an insulating layer 141 on a lower side of the core member 110 on which the first insulating layer 111A is disposed, a wiring layer 142, and a via 143 passing through the insulating layer 141 and connecting the wiring layer 142 to at least one of the first wiring layer 112A of the core member 110 and the first electronic component 120A. In this case, the via 143, connected to the first electronic component 120A, may directly contact and be then connected to the first electronic component 120A.

The second through-portion 110HB may expose at least a portion of the first insulating layer 111A and/or at least a portion of the second wiring layer 112B disposed on the first insulating layer 111A. In this case, the second wiring layer 112B exposed by the second through-portion 110HB may be covered with the insulating resin 130. For example, the second wiring layer 112B may include a wiring pattern in which at least a portion of an upper surface of the second wiring layer 112B is covered by the second insulating layer 111B, and a wiring pattern in which at least a portion of the upper surface of the second wiring layer 112B is covered by the insulating resin 130. In this case, as described below, the second electronic component 120B may be connected to the wiring pattern in which the at least a portion of the upper surface of the second wiring layer 112B, among the wiring patterns of the second wiring layer 112B, is covered with the insulating resin 130. Each of the first through-portion 110HA and the second through-portion 110HB may have a rectangular shape on a plane, but are not limited thereto.

In at least any one of cross-sections, a width of the second through-portion 110HB may be wider than a width of the first through-portion 110HA. In addition, in at least any one of cross-sections, a width of the second electronic component 120B disposed in the second through-portion 110HB may be also wider than a width of the first electronic component 120A disposed in the first through-portion 110HA. In some cross-sections, a width of the second through-portion 110HB may be narrower than or equal to a width of the first through-portion 110HA.

As will be described later, when the second through-portion 110HB is formed in the second insulating layer 111B, the second wiring layer 112B exposed by the second through-portion 110HB may play a role as a stopper layer, a process stop layer. For example, after the formation of the second through-portion 110HB, a lower surface of the second through-portion 110HB may have a region in which the second wiring layer 112B is disposed. In this case, in a region in which the second wiring layer 112B is not disposed, the second insulating layer 111B may be further processed to expose the first insulating layer 111A. Therefore, the exposed first insulating layer 111A may be further processed to form the first insulating layer 111A. According to this process, a side surface of the wiring pattern of the second wiring layer 112B exposed by the second through-portion 110HB may have a region in which a surface thereof is substantially coplanar with a wall surface of the first through-portion 110HA. This is because the first through-portion 110HA may be formed along some boundary of the second wiring layer 112B on a plane. "Substantially coplanar" in the present specification may be a concept including an absolutely coplanar surface as well as including tolerance ranges for process errors in the absolutely coplanar surface.

In the drawings, the second wiring layer 112B is illustrated to cover the entire region in which the second through-portion 110HB is formed among upper surfaces of the first insulating layer 111A, to provide only the second wiring layer 112B on the lower surface of the second through-portion 110HB. However, this is to clearly illustrate that the second wiring layer 112B may serve as a stopper layer, and a configuration of the present disclosure is not limited as illustrated in the drawings. For example, the second wiring layer 112B may not be disposed in at least a portion of the upper surface of the first insulating layer 111A in which the second through-portion 110HB is formed, depending on a design and/or a processing manner thereof. Therefore, a region in which the first insulating layer 111A is disposed and a region in which the second wiring layer 112B is disposed may coexist in the lower surface of the second through-portion 110HB.

Figure 7:
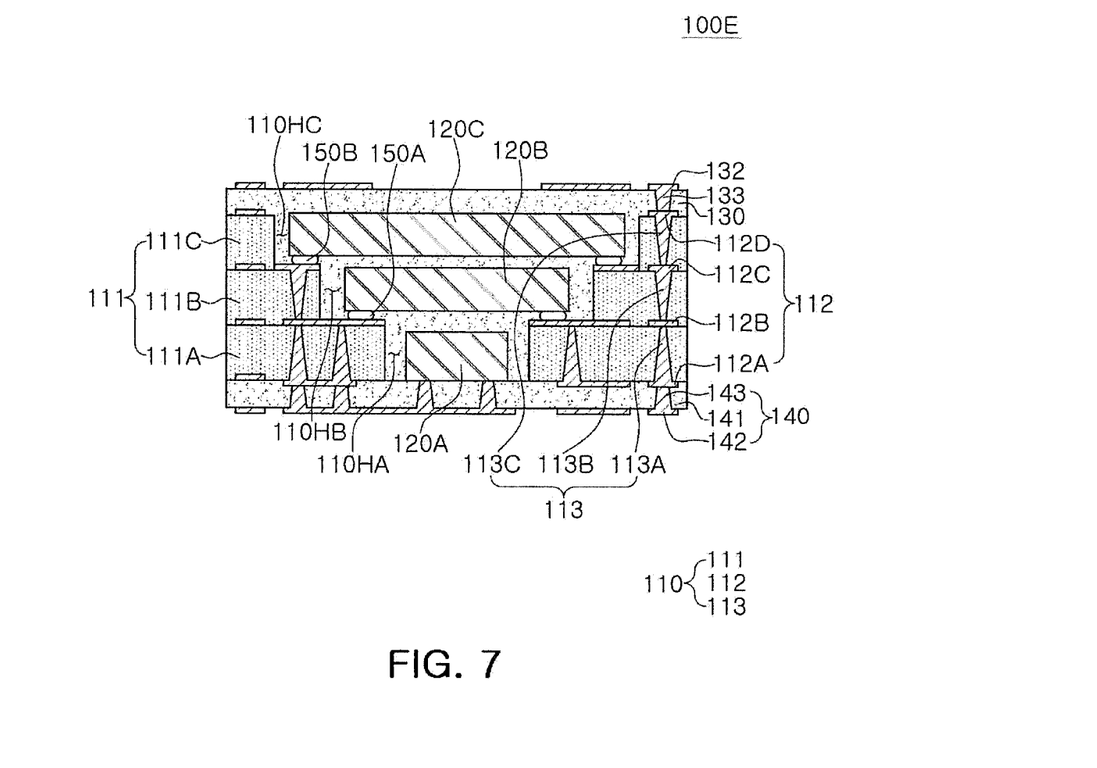
FIG. 7 is a cross-sectional view schematically illustrating an electronic component embedded substrate 100E according to another example.

In addition, although the wiring pattern of the second wiring layer 112B disposed on the lower surface of the second through-portion 110HB is illustrated in the drawings to extend onto a wall surface of the second through-portion 110HB, a configuration of the present disclosure is not limited, as illustrated in the drawings. For example, as illustrated in FIG. 7, a wiring pattern of a second wiring layer 112B disposed on a lower surface of a second through-portion 110HB may extend to an inner side of a second insulating layer 111B to cover a portion of the second insulating layer 111B. Alternatively, the wiring pattern of the second wiring layer 112B disposed on the lower surface of the second through-portion 110HB may be covered with an insulating resin 130, without extending to a wall surface of the second through-portion 110HB. Therefore, as described above, the first insulating layer 111A may be disposed in a portion of the lower surface of the second through-portion 110HB.

The second electronic component 120B may be connected to the wiring pattern of the second wiring layer 112B exposed by the second through-portion 110HB. In this case, the second electronic component 120B may be connected to the wiring pattern of the second wiring layer 112B through a connection conductor 150.

The first electronic component 120A and the second electronic component 120B may be arranged to be spaced apart from each other. In this case, the insulating resin 130 may fill at least a portion of a space between the first electronic component 120A and the second electronic component 120B. Therefore, the first electronic component 120A and the second electronic component 120B may be spaced apart from each other by the insulating resin 130.

There are cases in which a plurality of substrates, respectively embedding a plurality of electronic components may be stacked to form an electronic component embedded substrate. In these cases, it may be difficult to provide a thinner substrate because the entire electronic component embedded substrate may be inevitably thickened. In addition, there may be problems that it is not easy to implement a relatively high-density substrate due to limitation of interlayer matching between a plurality of substrates.

In addition, there are cases in which a plurality of electronic components may be bonded to each other in the cavity of the core substrate, with an adhesive member or the like, to form an electronic component embedded substrate. In these cases, since a plurality of electronic components may inevitably be in contact with each other, there may be problems such as heat generation due to heat transfer between the electronic components. In addition, in an electronic component disposed relatively distantly from the wiring layer disposed on a side of the substrate, there may be problems in that a signal path with the wiring layer may be elongated.

In a case of an electronic component embedded substrate 100A according to an example, a first electronic component 120A may be disposed on a first through-portion 110HA of a core member 110, and a second electronic component 120B may be disposed in a second through-portion 110HB to implement the thinning. In addition, since a first wiring layer 112A is not disposed on a first insulating layer 111A and has a structure covered with the first insulating layer 111A, the thinning may be further implemented. In addition, a second electronic component 120A may be connected to a wiring pattern of a second wiring layer 112B exposed by the second through-portion 110HB, directly through a connection conductor 150. Therefore, a signal path between an electronic component and a wiring layer may be shortened. In addition, a plurality of wiring layers 112A to 112C included in the core member 110 may be utilized to improve a degree of freedom of wiring design.

Hereinafter, each configuration of an electronic component embedded substrate 100A according to an example will be described in more detail.

Each of the first through-portion 110HA and the second through-portion 110HB may pass through each of the first insulating layer 111A and the second insulating layer 111B. Each of the first through-portion 110HA and the second through-portion 110HB may be formed by a sandblasting process using abrasive particles, a dry etching process using plasma, a mechanical drill, a laser drill, and/or the like.

As described above, when the second through-portion 110HB is formed in the second insulating layer 111B, the second wiring layer 112B exposed by the second through-portion 110HB may play a role as a stopper layer, a process stop layer. For example, after the formation of the second through-portion 110HB, the lower surface of the second through-portion 110HB may have the region in which the second wiring layer 112B is disposed. In this case, in the region in which the second wiring layer 112B is not disposed, the second insulating layer 111B may be further processed to expose the first insulating layer 111A. Therefore, the exposed first insulating layer 111A may be further processed to form the first through-portion 110HA. According to this process, the side surface of the wiring pattern of the second wiring layer 112B exposed by the second through-portion 110HB may have the region in which the surface thereof is substantially coplanar with the wall surface of the first through-portion 110HA. This is because the first through-portion 110HA may be formed along some boundary of the second wiring layer 112B on the plane.

When the first through-portion 110HA is processed, a portion of the first insulating layer 111A may remain on the lower surface of the first through-portion 110HA. In addition, when the second through-portion 110HB is processed, a portion of the second insulating layer 111B may remain on the lower surface of the second through-portion 110HB. In some cases, the second through-portion 110HB may further pass through a portion of the insulating layer 111A.

Each of the first through-portion 110HA and the second through-portion 110HB may have various shapes according to a processing manner. For example, a width of the first through-portion 110HA and/or the second through-portion 110HB may not be constant in a penetration direction. For example, the first through-portion 110HA and/or the second through-portion 110HB may have a shape in which a width thereof is narrowed in a downward direction.

A material for forming each of the first insulating layer 111A and the second insulating layer 111B is not particularly limited, and any material may be used as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

Formation materials of each of the first insulating layer 111A and the second insulating layer 111B may be the same as or may be different from each other. In addition, a thickness of each of the first insulating layer 111A and the second insulating layer 111B may be the same as or may be different from each other.

The thickness of the first insulating layer 111A may be greater than a thickness of the first electronic component 120A. Therefore, an upper surface of the first insulating layer 111A may be located on a level higher than an upper surface of the first electronic component 120A. Therefore, the first electronic component 120A may be spaced apart from the second electronic component 120B disposed on the second wiring layer 112B. In this case, the insulating resin 130 may fill the at least portion of the space between the first electronic component 120A and the second electronic component 120B.

Similarly, a thickness of the second insulating layer 111B may be greater than a thickness of the second electronic component 120B. However, the present disclosure is not limited thereto. A thickness of each of the first insulating layer 111A and the second insulating layer 111B may be substantially equal to, or may be thinner than a thickness of each of the first electronic component 120A and the second electronic component 120B.

In addition, the lower surface of the first insulating layer 111A may be substantially coplanar with the lower surface of the first electronic component 120A. The lower surface of the first wiring layer 112A buried in the lower surface of the first insulating layer 111A may also be substantially coplanar with the lower surface of the first electronic component 120A.

As a material for forming each of the first wiring layer 112A, the second wiring layer 112B, and the third wiring layer 112C, a conductive material such as copper (Cu), aluminum (Al), silver (Ag), tin (Sn), gold (Au), nickel (Ni), lead (Pb), titanium (Ti), alloys thereof, or the like may be used. Each of the first wiring layer 112A, the second wiring layer 112B, and the third wiring layer 112C may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

The first wiring layer 112A may be buried in the first insulating layer 111A, such that at least a portion of each of upper and side surfaces of the first wiring layer 112A may be covered with the first insulating layer 111A. In addition, a lower surface of the first wiring layer 112A may be substantially coplanar with a lower surface of the first insulating layer 111A and/or a lower surface of the first electronic component 120A.

A portion of the wiring pattern of the second wiring layer 112B may be exposed by the second through-portion 110HB. Therefore, the second electronic component 120B may be connected to the wiring pattern of the second wiring layer 112B exposed by the second through-portion 110HB. In this case, the second electronic component 120B may be connected to the wiring pattern of the second wiring layer 112B through the connection conductor 150. The wiring pattern of the second wiring layer 112B exposed by the second through-portion 110HB protrudes from the first insulating layer 111A, such that at least a portion of each upper and side surfaces thereof may be covered with the insulating resin 130.

As illustrated in the drawings, the first wiring layer 112A may be buried in the lower portion of the first insulating layer 111A, and as illustrated in the drawings, the first wiring layer 112A may be disposed on the lower surface of the first insulating layer 111A. As illustrated in the drawings, in the second wiring layer 112B, at least a portion of the second wiring layer 112B may be also buried in the lower portion of the second insulating layer 111B, and as illustrated in the drawings, the second wiring layer 112B may be disposed on the lower surface of the second insulating layer 111B. When at least a portion of the second wiring layer 112B is disposed on the lower surface of the second insulating layer 111B, at least a portion of the second wiring layer 112B may be buried in the first insulating layer 111A. As illustrated in the drawings, the third wiring layer 112C may also be disposed on the upper surface of the second insulating layer 111B, and as illustrated in the drawings, the third wiring layer 112C may be buried in the upper portion of the second insulating layer 111B.

The first via 113A may pass through the first insulating layer 111A, and may connect the first wiring layer 112A and the second wiring layer 112B to each other. In addition, the second via 113B may pass through the second insulating layer 111B, and may connect the second wiring layer 112B and the third wiring layer 112C to each other. Therefore, the plurality of wiring layers 112A to 112C of the core member 110 may be electrically connected therebetween.

As a material for forming each of the first via 113A and the second via 113B, a conductive material such as copper (Cu), aluminum (Al), silver (Ag), tin (Sn), gold (Au), nickel (Ni), lead (Pb), titanium (Ti), alloys thereof, or the like may be used. Each of the first via 113A and the second via 113B may be entirely filled with a conductive material, or the conductive material may be formed along a wall of the via. When the via includes a conductive material formed along a wall of a via hole, an insulating material may fill the via hole. In addition, a shape of each of the first via 113A and the second via 113B may be any shape known in the art, such as a tapered shape, a cylindrical shape, or the like.

When the first via 113A and the second via 113B have a tapered shape, the first via 113A and the second via 113B may have shapes tapered in the same direction. For example, as illustrated in the drawings, the first via 113A and the second via 113B may have a shape in which a width thereof is narrowed in the downward direction.

In addition, when the first via 113A and/or the second via 113B have a tapered shape, the first via 113A and/or the second via 113B may have a shape tapered in directions, opposite to the via 143 of the connection member 140 to be described later. For example, as illustrated in the drawings, the first via 113A and the second via 113B may have a shape in which a width thereof is narrowed in the downward direction, and the via 143 of the connection member 140 may have a shape in which a width thereof is widened in the downward direction.

As illustrated in the drawings, the first via 113A may have a structure integrated with the wiring pattern of the second wiring layer 112B connected to the first via 113A. The second via 113B may have a structure integrated with the wiring pattern of the third wiring layer 112C connected to the second via 113B.

Each of the first electronic component 120A and the second electronic component 120B may be an active component such as a semiconductor chip, an integrated circuit (IC), or the like, and may be a passive component such as a multilayer ceramic capacitor (MLCC), a low inductance chip capacitor (LICC), an inductor, or the like. In addition, each of the first electronic component 120A and the second electronic component 120B may include a connection pad and/or an electrode for an electrical connection.

The first electronic component 120A may be in contact with and directly connected to the via 143 of the connection member 140. In addition, the second electronic component 120B may be connected to the second wiring layer 112B of the core member 110 through the connection conductor 150.

The insulating resin 130 may cover at least a portion of each of the first electronic component 120A and the second electronic component 120B. In addition, the insulating resin 130 may fill at least a portion of each of the first through-portion 110HA and the second through-portion 110HB. For example, the insulating resin 130 may cover upper and side surfaces of each of the first electronic component 120A and the second electronic component 120B, and may fill a space between the first through-portion 110HA and the first electronic component 120A and a space between the second through-portion 110HB and the second electronic component 120B. In addition, at least a portion of a space between the first electronic component 120A and the second electronic component 120B may be filled with the insulating resin 130.

In addition, the insulating resin 130 may cover at least a portion of the first insulating layer 111A and/or the second wiring layer 112B, exposed by the second through-portion 110HA. In addition, the insulating resin 130 may cover an upper surface of the second insulating layer 111B and at least a portion of the third wiring layer 112C.

A material for forming the insulating resin 130 is not particularly limited, and any material may be used as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The wiring layer 132 may be disposed on the insulating resin 130, and may be connected to the third wiring layer 112C of the core member 110.

As a material for forming the wiring layer 132, a conductive material such as copper (Cu), aluminum (Al), silver (Ag), tin (Sn), gold (Au), nickel (Ni), lead (Pb), titanium (Ti), alloys thereof, or the like may be used. The wiring layer 132 may perform various functions, depending on a design thereof. For example, a ground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

The via 133 may pass through the insulating resin 130, and may connect the wiring layer 132 and the third wiring layer 112C of the core member 110 to each other. The via 133 may be integrated with the wiring layer 132 connected thereto.

As a material for forming the via 133, a conductive material such as copper (Cu), aluminum (Al), silver (Ag), tin (Sn), gold (Au), nickel (Ni), lead (Pb), titanium (Ti), alloys thereof, or the like may be used. The via 133 may be entirely filled with a conductive material, or the conductive material may be formed along a wall of the via. When the via includes a conductive material formed along a wall of a via hole, an insulating material may fill the via hole. In addition, a shape of the via 133 may be applied to all shapes known in the art, such as a tapered shape, a cylindrical shape, or the like.

Depending on a design, an insulating layer, a wiring layer, a via, and/or the like, may be further disposed on the insulating resin 130.

The connection member 140 may be disposed below the core member 110, and may include an insulating layer 141, a wiring layer 142 disposed below the insulating layer 141, and a via 143 passing through the insulating layer 141 and connecting the wiring layer 142 to at least one of the first wiring layer 112A of the core member 110 and the first electronic component 120A.

Depending on a design, an insulating layer, a wiring layer, a via, and/or the like, may be further disposed below the connection member 140.

A material for forming the insulating layer 141 of the connection member 140 is not particularly limited, and any material may be used as long as it has insulating properties. For example, a thermosetting resin such as an epoxy resin, a thermoplastic resin such as polyimide, or materials including reinforcing materials such as inorganic fillers, and/or glass cloth, glass fabric, or the like, together therewith, such as prepreg, Ajinomoto Build-up Film (ABF), FR-4, bismaleimide triazine (BT), and the like may be used. As necessary, a photoimageable dielectric (PID) resin may be used.

The insulating layer 141 of the connection member 140 may be thinner than each of the first insulating layer 111A and the second insulating layer 111B. However, the present disclosure is not limited thereto, and a thickness of the insulating layer 141 may be substantially the same as a thickness of each of the first insulating layer 111A and the second insulating layer 111B, and the insulating layer 141 may be thicker than each of the first insulating layer 111A and the second insulating layer 111B.

The wiring layer 142 of the connection member 140 may be disposed below the insulating layer 141, and may be connected to the first wiring layer 112A and/or the first electronic component 120A. In addition, the wiring layer 142 of the connection member 140 may also be connected to the second electronic component 120B through the first wiring layer 112A and the second wiring layer 112B.

As a material for forming the wiring layer 142 of the connection member 140, a conductive material such as copper (Cu), aluminum (Al), silver (Ag), tin (Sn), gold (Au), nickel (Ni), lead (Pb), titanium (Ti), alloys thereof, or the like may be used. The wiring layer 142 of the connection member 140 may perform various functions, depending on a design thereof. For example, aground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. In addition, a via pad or the like may be included.

The via 143 of the connection member 140 may pass through the insulating layer 141, and may connect the wiring layer 142 of the connection member 140 to the first wiring layer 112A of the core member 110 and/or the first electronic component 120A. As described above, the via 143 of the connection member 140 may be in direct contact with and connected to the first electronic component 120A.

As a material for forming the via 143 of the connection member 140, a conductive material such as copper (Cu), aluminum (Al), silver (Ag), tin (Sn), gold (Au), nickel (Ni), lead (Pb), titanium (Ti), alloys thereof, or the like may be used. The via 143 of the connection member 140 may be entirely filled with a conductive material, or the conductive material may be formed along a wall of the via. When the via includes a conductive material formed along a wall of a via hole, an insulating material may fill the via hole. In addition, a shape of the via 143 of the connection member 140 may be applied to all shapes known in the art, such as a tapered shape, a cylindrical shape, or the like.

When the via 143 of the connection member 140 has a tapered shape, the via 143 of the connection member 140 may have a shape tapered in a direction, opposite to the first via 113A and/or the second via 113B of the core member 110 according to a process. For example, as illustrated in the drawings, the first via 113A and the second via 113B of the core member 110 may have a shape in which a width thereof is narrowed in the downward direction, and the via of the connection member 140 may have a shape in which a width thereof is widened in the downward direction.

The connection conductor 150 may connect the second electronic component 120B to the second wiring layer 112B of the core member 110. A material for forming the connection conductor 150 may include a solder and/or a conductive paste. However, the present disclosure is not limited thereto, and as the material for forming the connection conductor 150, any material may be used as long as it has insulating properties. The connection conductor 150 may also serve to fix the second electronic component 120B to the second wiring layer 112B.

Figure 4:
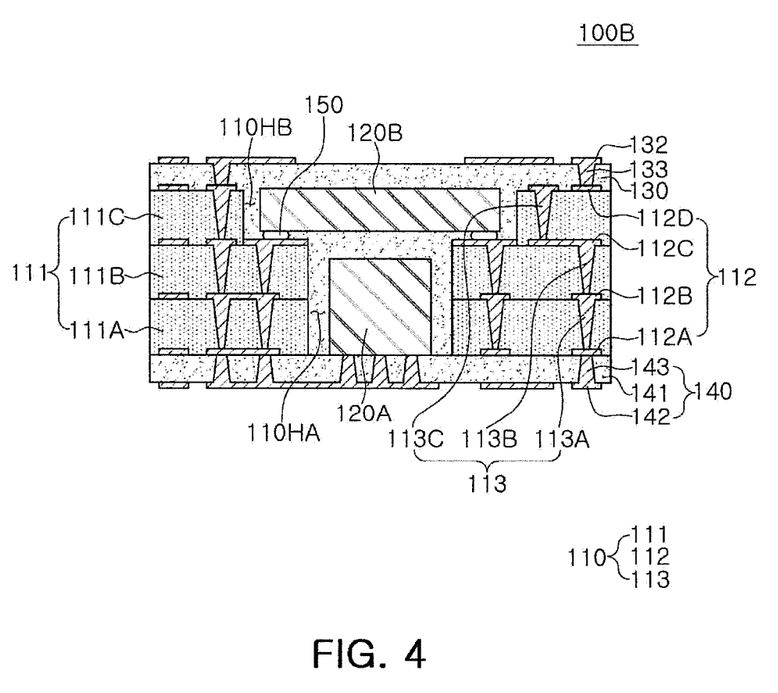
FIG. 4 is a cross-sectional view schematically illustrating an electronic component embedded substrate 100B according to another example.

FIG. 4 is a cross-sectional view schematically illustrating an electronic component embedded substrate 100B according to another example.

Referring to the drawings, in an electronic component embedded substrate 100B according to another example, compared to the electronic component embedded substrate 100A according to an example, a core member 110 may include a first wiring layer 112A, a first insulating layer 111A covering the first wiring layer 112A, a second wiring layer 112B disposed on the first insulating layer 111A, a first via 113A passing through the first insulating layer 111A and connecting the first wiring layer 112A and the second wiring layer 112B to each other, a second insulating layer 111B disposed on the first insulating layer 111A, a third wiring layer 112C disposed on the second insulating layer 111B, a second via 113B passing through the second insulating layer 111B and connecting the second wiring layer 112B and the third wiring layer 112C to each other, a third insulating layer 111C disposed on the second insulating layer 111B, a fourth wiring layer 112D disposed on the third insulating layer 111C, and a third via 113C passing through the third insulating layer 111C and connecting the third wiring layer 112C and the fourth wiring layer 112D to each other.

In addition, a first through-portion 110HA may pass through the first insulating layer 111A and the second insulating layer 112B.

The first electronic component 120A may be thicker than the second electronic component 120B. In the electronic component embedded substrate 100B according to another example, since the first through-portion 110HA passes through the first insulating layer 111A and the second insulating layer 112B together, the first through-portion 110HA may be deeply formed, compared to the electronic component embedded substrate 100A according to an example. Therefore, the first electronic component 120A having a relatively thick thickness may be embedded. In addition, as the number of wiring layers included in the core member 110 increases, a degree of freedom of wiring design may also be further improved.

Since the others may be substantially the same as those described in the electronic component embedded substrate 100A according to an example, detailed descriptions thereof will be omitted.

Figure 5:
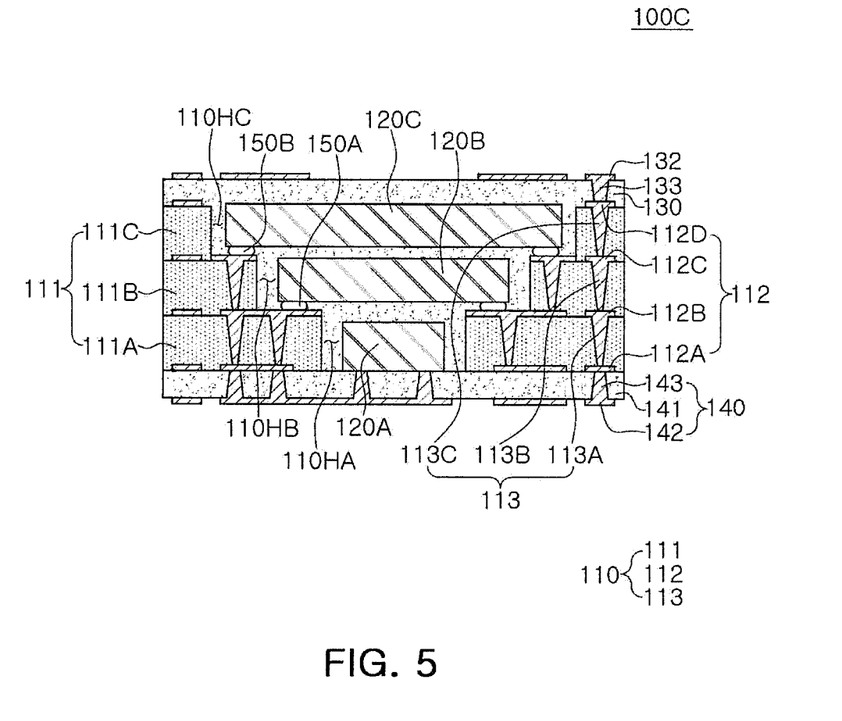
FIG. 5 is a cross-sectional view schematically illustrating an electronic component embedded substrate 100C according to another example.

FIG. 5 is a cross-sectional view schematically illustrating an electronic component embedded substrate 100C according to another example.

Referring to the drawings, in an electronic component embedded substrate 100C according to another example, compared to the electronic component embedded substrate 100A according to an example, a core member 110 may include a first wiring layer 112A, a first insulating layer 111A covering the first wiring layer 112A, a second wiring layer 112B disposed on the first insulating layer 111A, a first via 113A passing through the first insulating layer 111A and connecting the first wiring layer 112A and the second wiring layer 112B to each other, a second insulating layer 111B disposed on the first insulating layer 111A, a third wiring layer 112C disposed on the second insulating layer 111B, a second via 113B passing through the second insulating layer 111B and connecting the second wiring layer 112B and the third wiring layer 112C to each other, a third insulating layer 111C disposed on the second insulating layer 111B, a fourth wiring layer 112D disposed on the third insulating layer 111C, and a third via 113C passing through the third insulating layer 111C and connecting the third wiring layer 112C and the fourth wiring layer 112D to each other. In addition, a third electronic component 120C may be further included.

A second through-portion 110HB may expose at least a portion of the first insulating layer 111A and/or the second wiring layer 112B disposed on the first insulating layer 111A, and a third through-portion 110HC may expose at least a portion of the second insulating layer 111B and/or the third wiring layer 112C disposed on the second insulating layer 111B. In addition, a first through-portion 110HA may pass through the first insulating layer 111A, the second through-portion 110HB may pass through the second insulating layer 111B, and the third through-portion 110HC may pass through the third insulating layer 111C. In at least one cross-section, a width of the third through-portion 110HC may be wider than a width of the second through-portion 110HB, and the width of the second through-portion 110HB may be wider than a width of the first through-portion 110HA.

In addition, in at least one cross-section, a width of the third electronic component 120C disposed in the third through-portion 110HC may be wider than a width of the second electronic component 120B, and a width of the second electronic component 120B disposed in the second through-portion 110HB may be wider than a width of the first electronic component 120A disposed on the first through-portion 110HA.

The second electronic component 120B may be disposed on a wiring pattern of the second wiring layer 112B exposed by the second through-portion 110HB, and may be connected to the wiring pattern of the second wiring layer 112B. In this case, the second electronic component 120B may be connected to the wiring pattern of the second wiring layer 112B by a first connection conductor 150A. Similarly, the third electronic component 120C may be disposed on a wiring pattern of the third wiring layer 112C exposed by the third through-portion 110HC, and may be connected to the wiring pattern of the third wiring layer 112C. In this case, the third electronic component 120C may be connected to the wiring pattern of the third wiring layer 112C by a second connection conductor 150B.

Since the others may be substantially the same as those described in the electronic component embedded substrate 100A according to an example, detailed descriptions thereof will be omitted.

Figure 6:
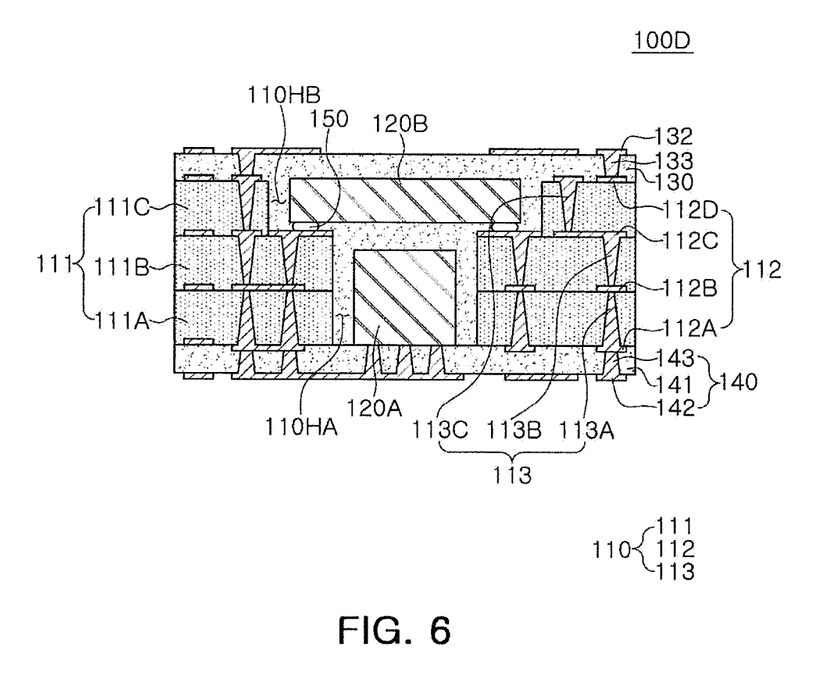
FIG. 6 is a cross-sectional view schematically illustrating an electronic component embedded substrate 100D according to another example.

FIG. 6 is a cross-sectional view schematically illustrating an electronic component embedded substrate 100D according to another example.

In an electronic component embedded substrate 100D according to another example, a first wiring layer 112A of a core member 110 may be disposed below a first insulating layer 111A, but may be not buried in the first insulating layer 111A, in a different manner to the electronic component embedded substrate 100B according to another example. In addition, a first via 113A of the core member 110 may have a shape tapered in a direction, opposite to that of the electronic component embedded substrate 100B according to another example. For example, as illustrated in the drawings, the first via 113A of the core member 110 may have a shape in which a width thereof is widened in the downward direction.

Since the others may be substantially the same as those described in the electronic component embedded substrate 100A according to an example and the electronic component embedded substrate 100B according to another example, detailed descriptions thereof will be omitted.

FIG. 7 is a cross-sectional view schematically illustrating an electronic component embedded substrate 100E according to another example.

In an electronic component embedded substrate 100E according to another example, a first wiring layer 112A of a core member 110 may be disposed below a first insulating layer 111A, but may be not buried in the first insulating layer 111A, in a different manner to the electronic component embedded substrate 100C according to another example. In addition, a first via 113A of the core member 110 may have a shape tapered in a direction, opposite to that of the electronic component embedded substrate 100B according to another example. For example, as illustrated in the drawings, the first via 113A of the core member 110 may have a shape in which a width thereof is widened in the downward direction.

Since the others may be substantially the same as those described in the electronic component embedded substrate 100A according to an example and the electronic component embedded substrate 100C according to another example, detailed descriptions thereof will be omitted.

Figure 8A:
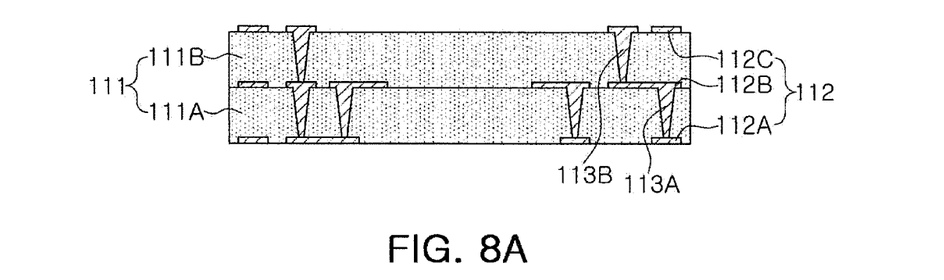
FIGS. 8A-8C schematically illustrates a manufacturing process of an electronic component embedded substrate 100A according to an example.
Figure 8B:
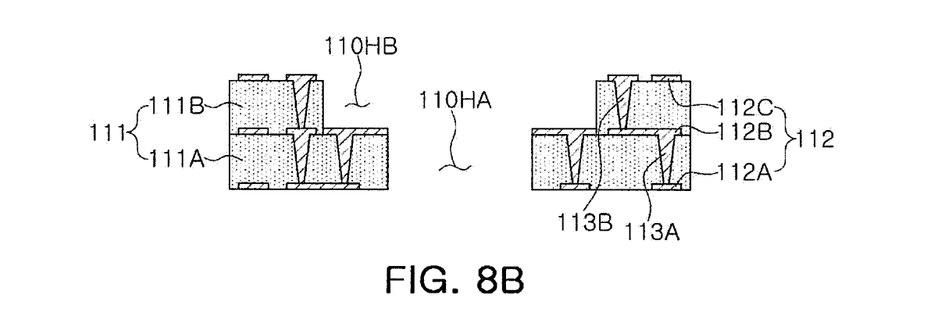
Figure 8C:
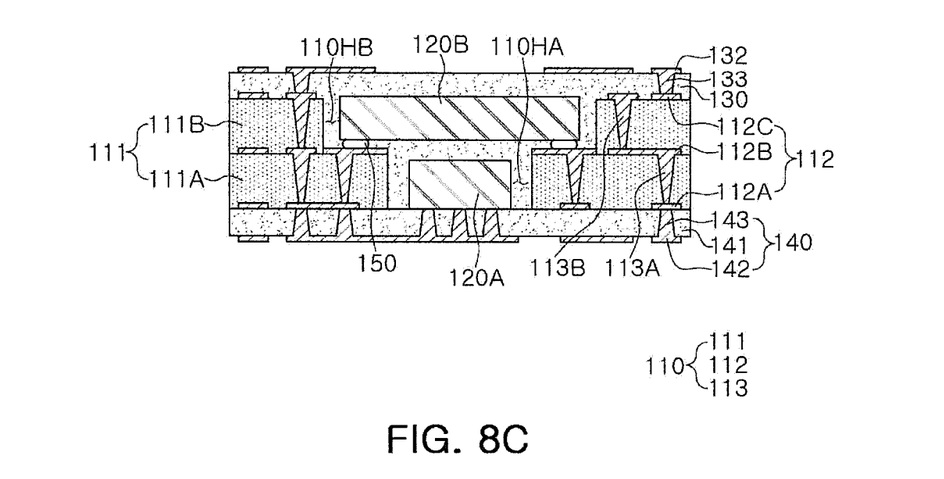

FIGS. 8A-8C schematically illustrates a manufacturing process of an electronic component embedded substrate 100A according to an example.

Referring to FIG. 8A, a core member 110 including a first wiring layer 112A, a first insulating layer 111A covering the first wiring layer 112A, a second wiring layer 112B disposed on the first insulating layer 111A, a first via 113A passing through the first insulating layer 111A and connecting the first wiring layer 112A and the second wiring layer 112B to each other, a second insulating layer 111B disposed on the first insulating layer 111A, a third wiring layer 112C disposed on the second insulating layer 111B, and a second via 113B passing through the second insulating layer 111B and connecting the second wiring layer 112B and the third wiring layer 112C to each other, may be prepared.

The core member 110 may include a plurality of insulating layers 111, a plurality of wiring layers 112, and a plurality of vias 113, and a configuration and/or structure of the core member 110 may be changed depending on a design.

Referring to FIG. 8B, a second through-portion 110HB passing through the second insulating layer 111B and a first through-portion 110HA passing through the first insulating layer 111A may be sequentially formed.

Each of the first through-portion 110HA and the second through-portion 110HB may be formed by a sandblasting process using abrasive particles, a dry etching process using plasma, a mechanical drill, a laser drill, and/or the like.

When the second through-portion 110HB is formed in the second insulating layer 111B, the second wiring layer 112B may play a role as a stopper layer, a process stop layer. For example, after the formation of the second through-portion 110HB, a lower surface of the second through-portion 110HB may have a region in which the second wiring layer 112B is disposed. In this case, in a region in which the second wiring layer 112B is not disposed, the second insulating layer 111B may be further processed to expose the first insulating layer 111A. Therefore, the exposed first insulating layer 111A may be further processed to form the first through-portion 110HA.

Referring to FIG. 8C, a first electronic component 120A and a second electronic component 120B may be disposed in the first through-portion 110HA and the second through-portion 110HB, respectively, and may be sealed with an insulating resin 130.

The first electronic component 120A may be disposed in the first through-portion 110HA by attaching a known tape or the like to a lower surface of the core member 110. The second electronic component 120B may be disposed to be fixed on the second wiring layer 112B by a connection conductor 150.

In addition, a via 133 passing through the insulating resin 130 may be formed, and a wiring layer 132 may be formed on the insulating resin 130.

A connection member 140 including an insulating layer 141, a via 143 passing through the insulating layer 141, and a wiring layer 142 disposed on the insulating layer 141 may be formed below the core member 110. When the first electronic component 120A is disposed using a known tape or the like, the first electronic component 120A may be first removed from the known tape or the like, before the connection member 140 is formed.

A manufacturing process of an electronic component embedded substrate 100A according to an example is not limited to the above description, and may be changed by those skilled in the art. For example, it may implement by changing a formation method, a formation order, a formation material, and the like of each component. In this case, modified examples may be concepts including addition and omission of a configuration.

In the present specification, the terms "upper portion," "on," "upper surface," "lower portion," "below," and "lower surface" may be used based on the drawings. However, it may be described in different terms depending on the relative arrangement between the components.

In this specification, the meaning of being "disposed" on a component is not limited to the direction of being disposed on or on an upper surface of the component. In some cases, it may be a case disposed below or on a lower surface of any component.

As used herein, the term "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection.

In the present specification, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The terms used in the present disclosure are used only to illustrate various examples and are not intended to limit the present inventive concept. Singular expressions include plural expressions unless the context clearly dictates otherwise.

The expression "example" used in this specification does not refer to the same example to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

As one effect of the present disclosure, an electronic component embedded substrate including a plurality of electronic components, capable of miniaturizing and thinning a product, may be provided.

As another effect of the present disclosure, an electronic component embedded substrate having improved freedom of wiring design may be provided.

While example examples have been illustrated and described above, it will be apparent to those skilled in the art that modifications and variations could be made without departing from the scope of the present disclosure as defined by the appended claims.

What is claimed is:

1. An electronic component embedded substrate comprising:
a core member including a first wiring layer, a first insulating layer covering the first wiring layer and having a first through-portion, a second wiring layer disposed on the first insulating layer, a second insulating layer disposed on the first insulating layer and having a second through-portion exposing at least a portion of the second wiring layer, a third wiring layer disposed on the second insulating layer, and a third insulating layer disposed on the second insulating layer and having a third through-portion exposing at least a portion of the third wiring layer;
a first electronic component disposed in the first through-portion;
a second electronic component disposed in the second through-portion;
a third electronic component disposed in the third through-portion; and
an insulating resin covering at least a portion of each of the first electronic component, the second electronic component, and the third electronic component,
wherein the second wiring layer includes a first wiring pattern in which at least a portion of an upper surface of the second wiring layer is covered with the second insulating layer, and a second wiring pattern in which at least a portion of the upper surface of the second wiring layer is covered with the insulating resin,
wherein the second electronic component is connected to the second wiring pattern,
the third wiring layer includes a third wiring pattern in which at least a portion of an upper surface of the third wiring layer is covered with the third insulating layer, and a fourth wiring pattern in which at least a portion of the upper surface of the third wiring layer is covered with the insulating resin, and
the third electronic component is connected to the fourth wiring pattern.

2. The electronic component embedded substrate according to claim 1, wherein the first electronic component and the second electronic component are spaced apart from each other, and
the insulating resin is disposed between at least a portion of a space between the first electronic component and the second electronic component.

3. The electronic component embedded substrate according to claim 1, wherein the first wiring layer is embedded in the first insulating layer and at least a portion of each of upper and side surfaces of the first wiring layer is covered with the first insulating layer, and
the second wiring pattern protrudes from the first insulating layer and at least a portion of each of upper and side surfaces of the second wiring pattern is covered with the insulating resin.

4. The electronic component embedded substrate according to claim 1, wherein a side surface of the second wiring pattern has a region coplanar with a wall surface of the first through-portion.

5. The electronic component embedded substrate according to claim 1, wherein the core member further comprises:
   a first via layer passing through the first insulating layer and connecting the first wiring layer and the second wiring layer to each other; and
   a second via passing through the second insulating layer and connecting the second wiring layer and the third wiring layer to each other.

6. The electronic component embedded substrate according to claim 5, wherein a via of the first via layer is integrated with at least a portion of the second wiring layer, and
   a via of the second via layer is integrated with at least a portion of the third wiring layer.

7. The electronic component embedded substrate according to claim 5, wherein a via of the first via layer and a via of the second via layer have shapes tapered in the same direction as each other.

8. The electronic component embedded substrate according to claim 7, further comprising a connection member including a fourth insulating layer disposed below the first insulating layer, a fourth wiring layer disposed below the fourth insulating layer, and a third via layer passing through the fourth insulating layer and connecting the fourth wiring layer to at least one of the first wiring layer and the first electronic component,
   wherein a via of the third via layer and a via of the first via layer respectively have shapes tapered in directions opposite to each other.

9. The electronic component embedded substrate according to claim 8, wherein another via of the third via layer is in contact with the first electronic component.

10. The electronic component embedded substrate according to claim 5, wherein the core member further comprises a fifth wiring layer disposed on the third insulating layer, and
    the electronic component embedded substrate further comprises:
    a sixth wiring layer disposed on the insulating resin;
    a fourth via passing through the insulating resin and connecting the third wiring layer and the fifth wiring layer to each other; and
    a fifth via passing through the insulating resin and connecting the fifth wiring layer and the sixth wiring layer to each other.

11. The electronic component embedded substrate according to claim 1, wherein the second electronic component is connected to the second wiring pattern through a connection conductor.

12. The electronic component embedded substrate according to claim 1, further comprising a connection member including a fourth insulating layer disposed below the first insulating layer, a fourth wiring layer disposed below the fourth insulating layer, and a via passing through the fourth insulating layer and being in contact with the first electronic component,
    wherein the second electronic component is connected to the second wiring pattern through a first connection conductor embedded in the insulating resin,
    wherein the third electronic component is connected to the third wiring pattern through a second connection conductor embedded in the insulating resin.

13. The electronic component embedded substrate according to claim 1, wherein the first wiring layer is disposed on a lower surface of the first insulating layer.

* * * * *